(12) United States Patent
Troyer et al.

(10) Patent No.: US 12,230,939 B2
(45) Date of Patent: Feb. 18, 2025

(54) PRE-CHARGE MODULATION OF A LASER ARRAY FOR 3D IMAGING APPLICATIONS

(71) Applicant: II-VI Delaware, Inc, Wilmington, DE (US)

(72) Inventors: Steve Troyer, Wilmington, DE (US); Jonathan Ashbrook, Wilmington, DE (US); Theron Jones, Wilmington, DE (US); Richard Davis, Wilmington, DE (US); Andrew Zocher, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 830 days.

(21) Appl. No.: 17/443,110

(22) Filed: Jul. 21, 2021

(65) Prior Publication Data
US 2023/0024188 A1 Jan. 26, 2023

(51) Int. Cl.
*H01S 5/042* (2006.01)
*G01B 11/24* (2006.01)
*H03K 5/13* (2014.01)
*H03K 17/687* (2006.01)

(52) U.S. Cl.
CPC ............ *H01S 5/0428* (2013.01); *G01B 11/24* (2013.01); *H03K 5/13* (2013.01); *H03K 17/6871* (2013.01)

(58) Field of Classification Search
CPC . H01S 5/0428; H01S 5/06216; H01S 5/06226
See application file for complete search history.

(56) References Cited

U.S. PATENT DOCUMENTS 8,787,415 B1 * 7/2014 Budai .................. H01S 5/0428
372/38.1

FOREIGN PATENT DOCUMENTS

CN 114079223 * 2/2022 ............. H01S 5/042

* cited by examiner

*Primary Examiner* — Xinning(Tom) Niu
*Assistant Examiner* — Delma R Forde
(74) *Attorney, Agent, or Firm* — Blank Rome LLP

(57) ABSTRACT

Laser drivers and methods are disclosed including a pulse input for receiving one or more logical pulse control signals, a delay circuit, a main pulse output, and a precharge pulse output for efficiently driving a laser with reduced time delay to desired optical output and reduced power consumption during between optical outputs.

16 Claims, 10 Drawing Sheets

PRE-CHARGE MODULATION OF A LASER ARRAY FOR 3D IMAGING APPLICATIONS

BACKGROUND OF THE INVENTION

Measuring the time delay of travel or arrival of light from a known source has been utilized to measure distances and will be referred to herein as distance or light scanning Such technology has been incorporated, for example into laser range finders and surveying equipment for measuring distances. However, it would be advantageous to incorporate such technology into smaller hand-held devices.

BRIEF SUMMARY OF THE INVENTION

Disclosed herein are systems and methods for driving and modulating a laser. In one aspect of the disclosure, a driver for driving a laser is disclosed, in which the driver includes a pulse input for receiving one or more logical pulse control signals, a delay circuit adapted to delay the one or more logical pulse control signals as one or more delayed pulses, a main pulse output adapted to trigger the laser's main current source, and a precharge pulse output adapted to trigger the laser's precharge current source. In another aspect of the disclosure, the driver includes control circuitry adapted to receive the one or more logical pulse control signals and the one or more delayed pulses and configured to selectively drive the main pulse output and the precharge pulse output to power the laser based on the received signals.

Methods of driving a laser are disclosed herein. In one aspect of the disclosure, a method for driving a laser includes providing a control signal to a pulse input, wherein the pulse input includes one or more logical pulse control signals, generating a delayed pulse by delaying the one or more logical pulse control signals by a delay $\Delta T$, driving the laser by outputting a main pulse output and a precharge pulse output based on the pulse input and the delayed pulse, wherein driving the laser comprises driving a precharge current source with the precharge pulse output and driving a main current source with main pulse output, wherein the precharge current source is adapted to supply a current through the laser greater than zero and less than a threshold current for the laser.

Further disclosed is a device for imaging a three-dimensional subject, the device including a transmitter having at least one laser configured to output optical signals; a laser driver in accordance with the disclosure coupled to the transmitter, a receiver having an array of photodiodes configured to receive the output optical signals reflected from the three-dimensional subject, and processing circuitry coupled to the receiver array and the driver, the processing circuitry configured to process the received optical signals synchronized with the output optical signals for imaging the three-dimensional subject.

DETAILED DESCRIPTION OF THE INVENTION

Incorporating distance (or light) scanning into man-portable devices, for example, handheld devices such as mobile phones, or other embedded systems, provides advantages. Such advantages include being lighter and smaller while also being able to integrate distance determinations with the increasing processing power and internet connectivity of mobile devices for other applications. For example, a plurality of distance measurements can be combined to create a point cloud to represent a three-dimensional (3D) surface or object in space. Such point clouds can optionally be further processed using on-device or off-device resources to, for example, identify objects or to be used in virtual or augmented reality applications.

However additional systems such as distance scanning, 3D scanning, and associated processing tasks can place resource strains on the power and processing systems on mobile devices, which are generally constrained by discrete battery capacities and processing speeds. Disclosed herein are systems and methods for distance scanning with improved efficiency in both power and processing demands.

Figure 1:
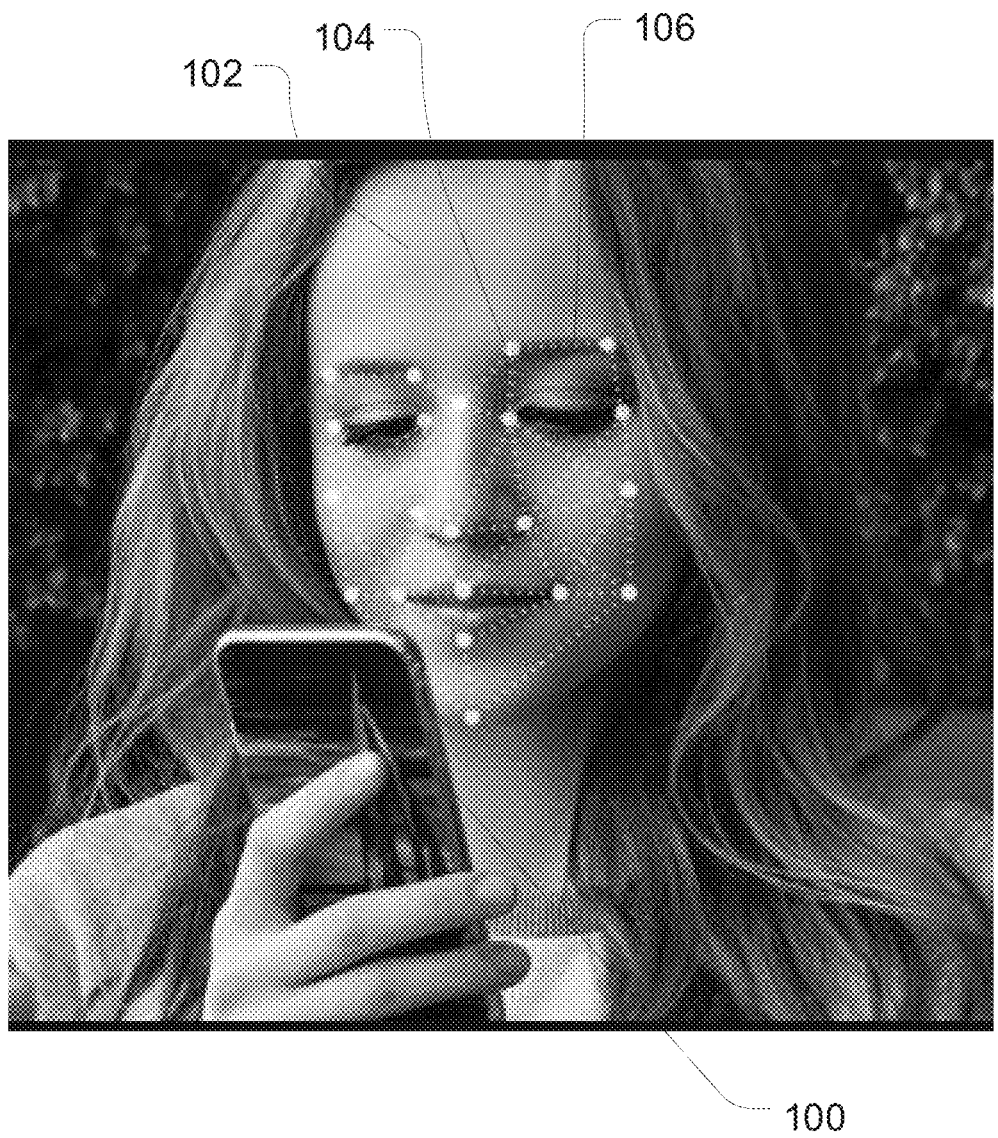
FIG. 1 shows a representation of a scanning device in accordance with disclosed embodiments.

FIG. 1 shows a representation of a scanning device 100, for example, a mobile phone or computer, containing light scanning elements and a dot representation 104 of the various points detected on a person's face 102. While a face 102 is shown, the detected points can be of any 3D object. The detection systems, for example software either residing on the mobile device or accessible by the mobile device through the internet (e.g., the cloud), may optionally then process the dot representation for detection of the object or for facial recognition. Such software may determine further abstractions of the dot representations 104, for example, wire/polygon mesh 106 for further detection algorithms.

Figure 2:
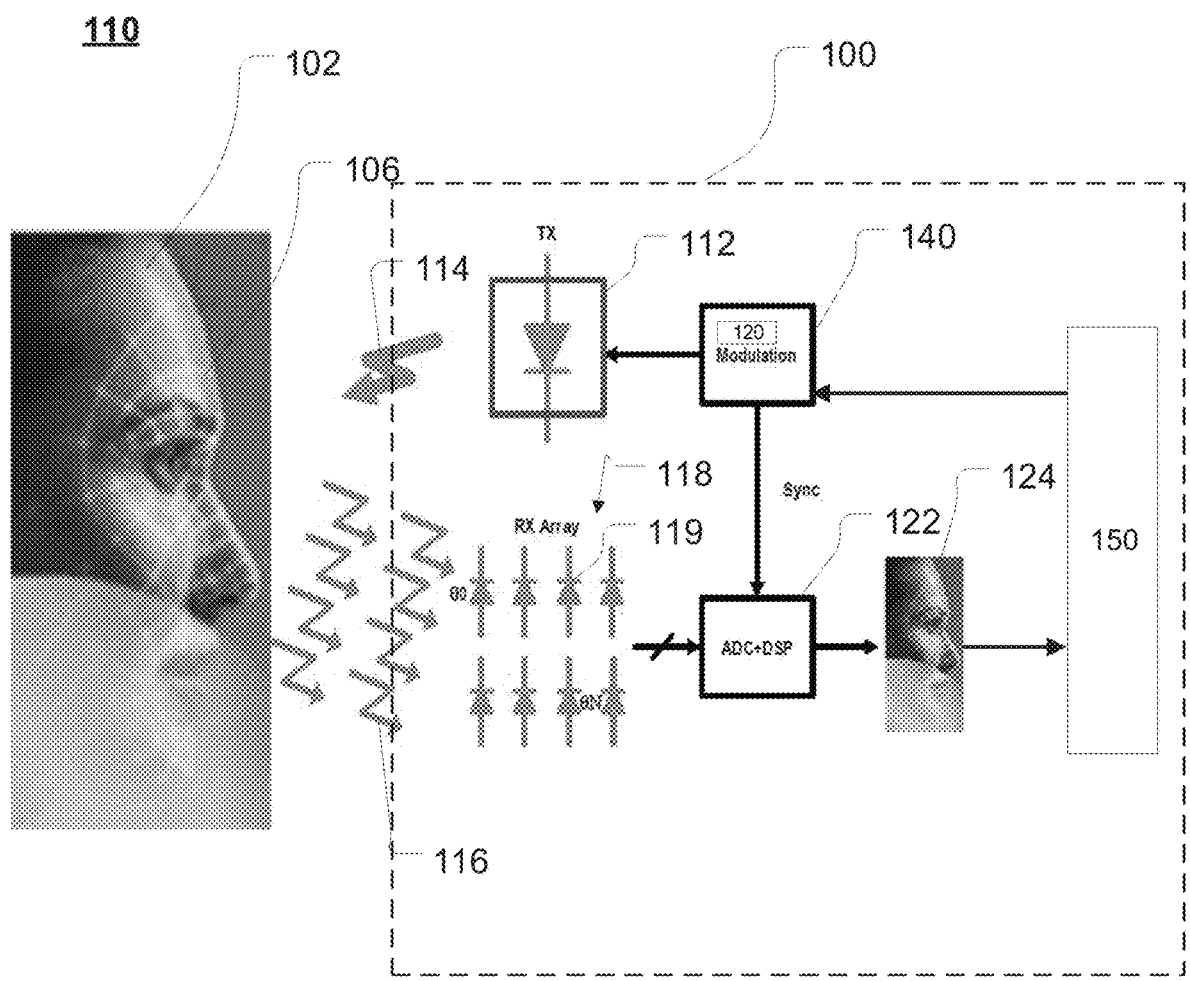
FIG. 2 shows a schematic block diagram in accordance with disclosed embodiments.

FIG. 2 shows a schematic representation of the imaging or scanning system 110 discussed with reference to FIG. 1, with elements typically within the scanning device 100 shown within the dashed box. While permutations are possible, one example scanning system 110 includes, a light source, which is shown in this example as laser 112, a receiver 118, modulation module 140 containing a driver 120, an analog to digital converter (ADC), and a digital signal processor (DSP). For simplicity, the ADC and DSP are shown together as ADC/DSP 122, which may be combined or be separate in various embodiments. The ADC/DSP 122 together interpret the reflected signals 116 from the RX array 119 to form the three-dimensional image of the target or other output 124. Also shown is a processor 150, which may be a mobile device processor or another processor responsible for imaging. The processor 150 interfaces with the modulation module 140 and the ADC/DSP 122 and will control requests for image scanning, control pulses (discussed below) as well as interfaces with the ADC/DSP 122 for receiving the output 124.

The light source 112 may be any light source in the visible or non-visible spectrum suitable for the intended illumination distance and detection capabilities, but should have illumination characteristics such that its emitted light 114 is sufficient to create detectable reflected light 116 by the receiver 118 when the emitted light 114 is incident onto the intended target, e.g., person 102. Lasers, for example laser 112, can be advantageous because they provide efficient concentration of emitted light 114. In particular, semiconductor lasers, for example vertical cavity surface emitting lasers (VCSELS), offer favorable light emitting efficiency based on their power characteristics in a size suitable for portable applications such as in mobile device 100 and also offer sufficient modulation speeds for the disclosed applications. The laser 112 may also be an array of lasers 112, for example a VCSEL array. For the remainder of this specification, VCSEL and laser will be used interchangeably.

The modulation module 140 may include the driver 120 and other interfaces for setting and/or receiving the scanning device 100 configurations, for example configuration registers (discussed below). The driver 120 provides the appropriate timing and modulation for the laser 112 and also provides the appropriate voltage and current characteristics to the laser 112 as well. The driver 120 may be in electrical communication with the ADC/DSP 122 so that the ADC/DSP 122 can compare the arrival time of the reflected light 116 with the emitted light 114 to determine the distance of the scanned object, e.g., person 102. The driver 120 may be an integrated circuit (IC) driver that be integrated with, or separate from, the laser 112. The output of the ADC/DSP 122 may also include connections to another processing system, for example, the mobile device 100 processor 150 for receiving commands/control signals and for sending the output 124 for further processing or for exchange with other systems.

Figure 3:
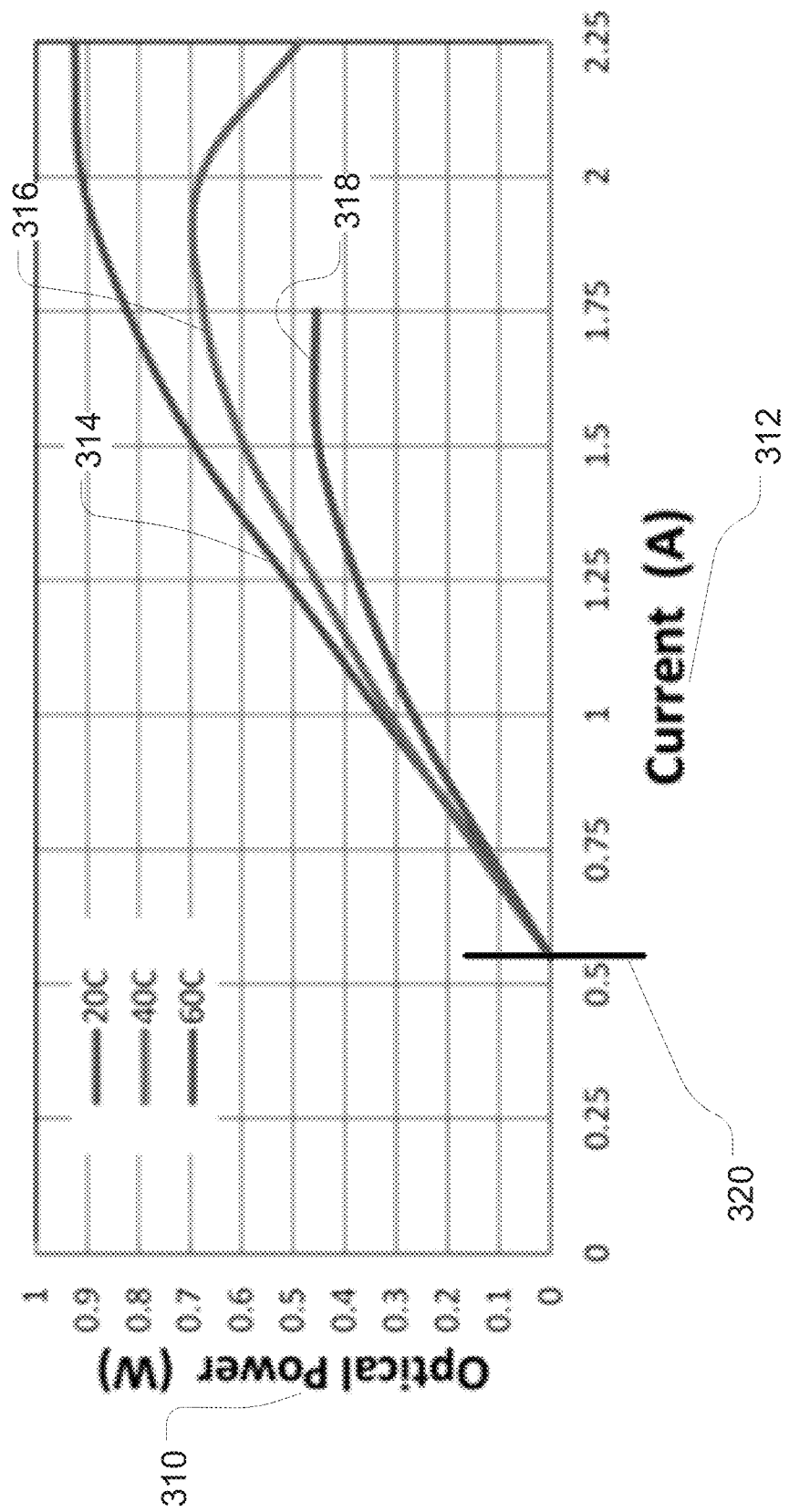
FIG. 3 shows example VCSEL light-versus-current (LI) characteristics for various temperatures.

Example VCSEL light-versus-current (LI) characteristics for various temperatures are illustrated in FIG. 3, which was available from https://ii-vi.com/product/940 nm-high-power-vcsel-die-in-ceramic-package-with-diffuser/(last accessed May 27, 2021) The graph shows the optical power output 310 of an example laser in watts (W) on the vertical axis versus the electrical current 312 through the laser in Amperes (Amps, or A) on the horizontal axis. FIG. 3 shows how optical power output varies based on current and also varies based on the temperature of the laser. Shown are examples with the laser at 20 degrees centigrade (C) (314), 40C (316), and 60C (318). In each example, it can be seen there is no or minimal optical power output 310 below a current threshold 320. That is, below the current threshold 320 electrical energy is being expended by the laser with no optical power output. As discussed below, the current threshold 320 can be used to establish a lower non-zero value for modulating the laser, such as the VCSEL disclosed herein. In this way, the current used to drive the VCSEL is modulated between two non-zero values with the lower value set just below such a threshold 320. The upper value is dictated by the desired optical power. A modulation scheme based on this approach, such as discussed below in FIG. 5, reduces the delay between the VCSEL drive current pulse rising edge and the VCSEL output optical pulse rising edge. Additionally, a device using a driver driving a laser based on this modulation scheme can have lower power consumption. The modulation scheme of the present disclosure is opposed to an approach used in FIG. 4.

Figure 4:
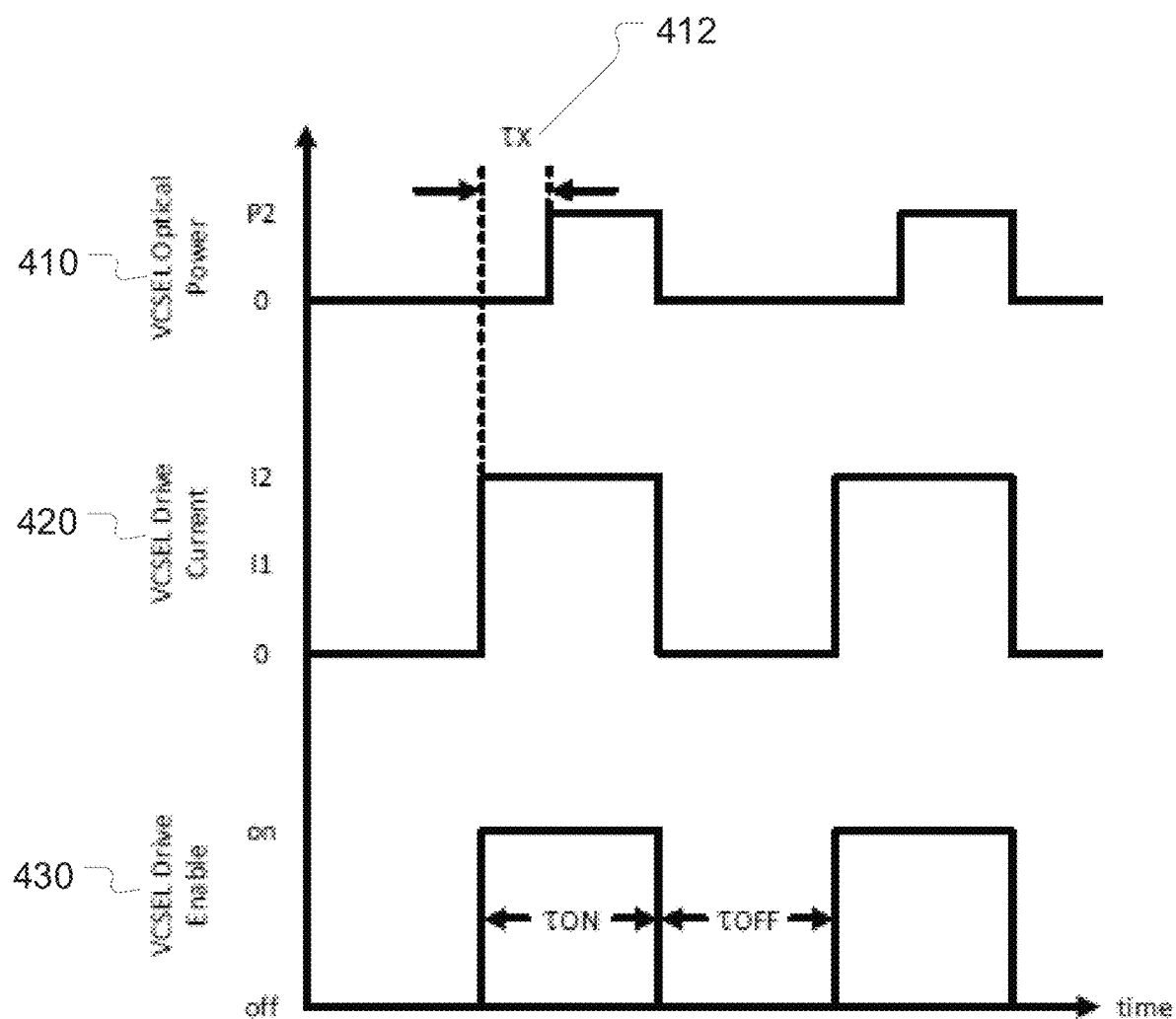
FIG. 4 shows an example timing diagram for driving a laser in accordance with disclosed embodiments.

For example, FIG. 4 shows a timing diagram of an example VCSEL optical power output 410 compared to the VCSEL drive current 420 and VCSEL drive enable 430, which is shown as a logical control. The VCSEL drive enable 430 signal may be a digital or analog control signal that triggers the flow of current through the VCSEL. This may be accomplished, for example, by using a voltage or current signal to close an appropriate transistor (e.g., bipolar junction transistors, field effect transistors, and their respective variations) in order to supply current from an appropriate current source through the VCSEL. As shown, there is a time delay $\tau x$ 412 between when current begins to flow through the VCSEL and when the optical power output reflects the characteristics of a VCSEL drive pulse. This time delay occurs each time the current is removed and then added to the VCSEL. When applications require the rapid pulsing of VCSELS, such time delays $\tau x$ add together and limit overall sampling speed/frequency of the pulses.

Figure 5:
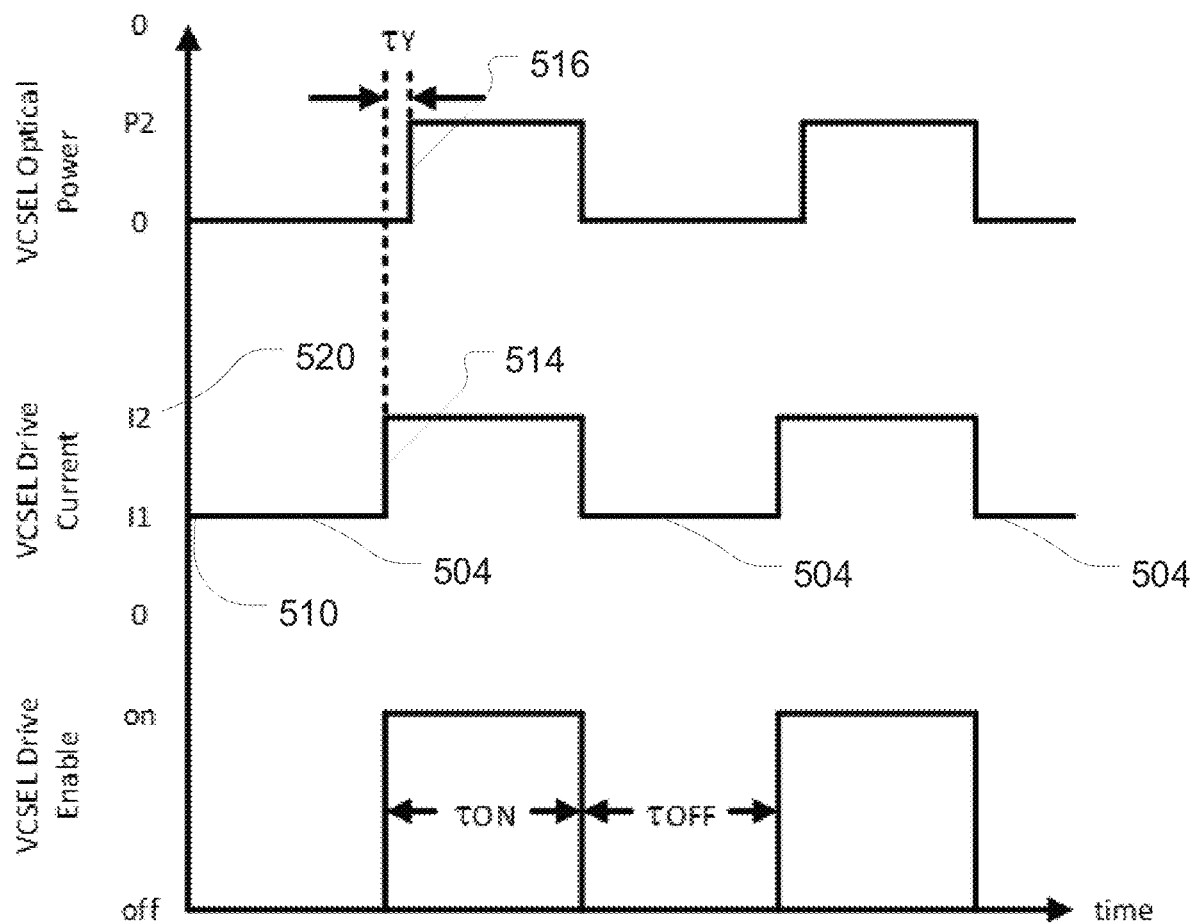
FIG. 5 shows an example timing diagram for driving a laser in accordance with disclosed embodiments.

In order to decrease the time delay, and thus improve sampling frequency, and to assist in creating an optical pulse that more accurately reflects the characteristics of the VCSEL drive pulse, e.g., the VCSEL drive enable pulse, the VCSEL current can be modulated between two non-zero values as shown for example in FIG. 5. As noted previously, the first current value 510 is I1, which is just below the threshold current (e.g., 320 from FIG. 3) and the second value 520 is dictated by the desired optical output power. The laser power driver control scheme of FIG. 5 can be implemented utilizing a laser driver having more than one current source. For example the iC-HK laser switch produced by iC Hause of Bodenheim, Germany, a data sheet for which is available at (https://www.ichaus.de/upload/pdf/hkan_2111es.pdf) (the "iC-HK laser switch"), the entirety of which is incorporated by reference herein, includes two current sources through parallel metal-oxide-semiconductor field-effect transistors (MOSFET) to select laser current level. Each current channel is selectable with respective enable control signals for each current channel.

When the VCSEL is being driven at the first current value 510, the laser 112 is in a "standby" state 504 where the VCSEL is just below the current required to create an optical output, but requires less time to transition to optical output. This modulation or driving scheme reduces the delay $\tau y$ 512 between the VCSEL drive current pulse rising edge 514 and the VCSEL output optical pulse rising edge 516. That is, $\tau y$ (FIG. 5) is less than $\tau x$ (FIG. 4) assuming other factors are consistent. When $\tau y < \tau x$, the duty cycle of the resulting optical pulse matches more closely the duty cycle of the drive current. However, total power consumption can be further improved by reducing the power consumption when the VCSEL is not outputting optical power, e.g., by reducing the power consumption during the sub-threshold standby state 504, when such power consumption would otherwise be wasted.

Figure 6:
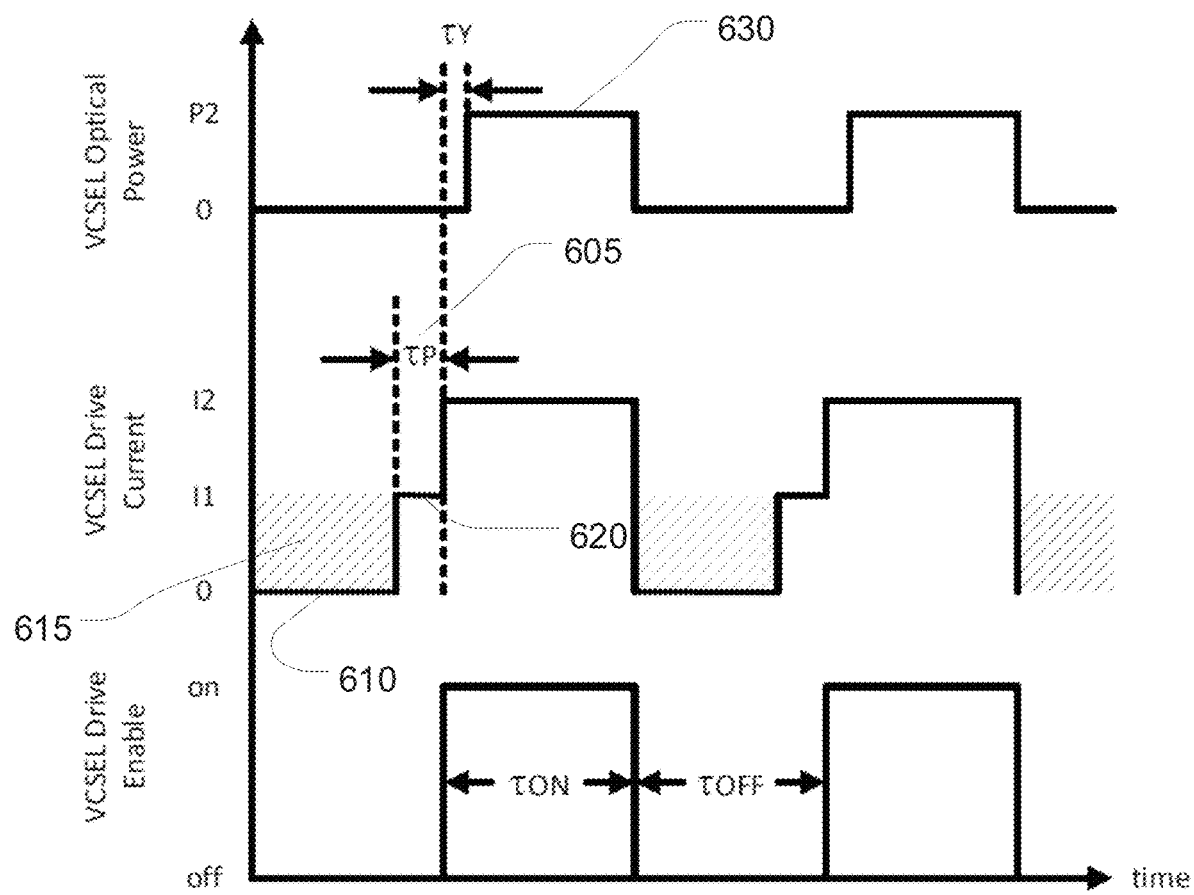
FIG. 6 shows an example timing diagram for driving a laser in accordance with disclosed embodiments.

FIG. 6 shows an alternative driving pattern in which a pre-charge time $\tau p$ 605 is utilized to reduce the power consumption when the VCSEL is not outputting optical power as noted above. The VCSEL in the timing diagram of FIG. 6 starts at an OFF state 610, where the drive current is zero and transitions from zero to a first current I1 620 standby state, which is just below threshold current, at a pre-charge time $\tau p$ ahead of the desired illumination interval $\tau ON$ when the VCSEL transitions from the standby (or pre-charge) state to an active state 630 at the desired optical power output. Because the VCSEL is transitioned to first current I1 prior to $\tau ON$, the delay $\tau y$ is still minimized. Additionally, the shaded area 615 represents power savings due the VCSEL being in an off state as compared to the standby state 504 (discussed with reference to FIG. 5) in which the VCSEL is still consuming power. Assuming the following operational parameters, which are merely exemplary, I1=0.55 A, I2=2 A, τON=2 ns, τOFF=2 ns, and τp=0.5 ns, then a 17% reduction in power may be realized while still maintaining the desired optical output characteristics and the previously discussed shorter delay τy discussed with reference to FIG. 5.

It should be noted that controlling the VCSEL current at a plurality of drive currents (in addition to zero) could be accomplished using parallel current sources and separate control/enable signals from a source controller for each parallel current source as discussed above. However, as shown in FIG. 6, the example implementation of having OFF, STANDBY, and ACTIVE can also be accomplished utilizing fewer VCSEL drive enable control signals, for example, a single VCSEL drive enable as shown in FIG. 6 for each laser or array that is controlled as a group. Such a configuration minimizes controller overhead and signal requirements. Discussed below with reference to FIGS. 7-10 are example driver configurations for such a feature.

Figure 7:
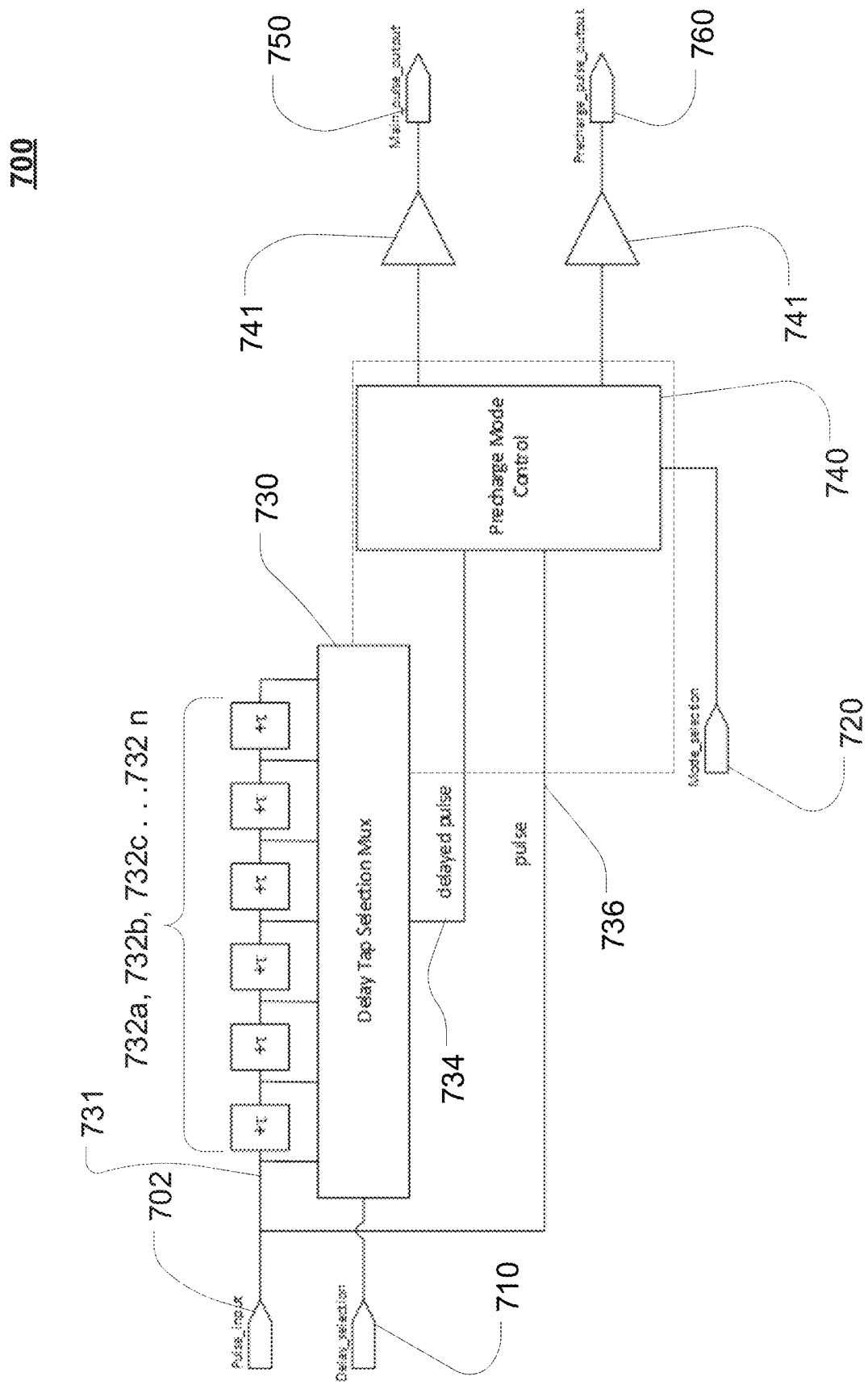
FIG. 7 shows an example block diagram for a driver in accordance with disclosed embodiments.

FIG. 7 shows an example block diagram for a circuit for a driver 700 for controlling two or more parallel current sources suitable for establishing an "off," "pre-charge (standby)," and "on" state, for example, for driving a VCSEL. The example shown will be disclosed using a single real-time control signal, pulse input 702; however, it should be understood that the driver 700 is scalable depending on the application and may further incorporate additional control signals for additional sets of parallel current sources.

Driver 700 includes pulse input 702 for receiving a logical pulse control signal to determine when to trigger pulse outputs, which will be discussed further below. Pulse input 702 can be, for example, a real-time (or near real-time) input from the processor 150 (FIG. 2) or other controller that determines when laser activity, e.g., for 3-D scanning is required. Driver 700 also includes selections or other inputs (710, 720) that may be implemented as non-real time configurations, for example, register settings. For outputs, driver 700 includes a main pulse output 750 and a precharge pulse output 760, each for, respectively controlling main and precharge current sources (an example of which is discussed with reference to FIG. 10, below)), through, for example, an appropriate relay or transistor. Also shown in FIG. 7 are delay segments 732 (732a through 732n), delay selection 710 and mode selection 720, a delay tap multiplexer 730, and precharge mode control 740, each of which will be discussed further below.

Delay segments 732 (732a-732n) can include any number of delay segments; however, six are shown in FIG. 7. Each delay segment 732 can create a delay of τ such that adding more delay segments 732 will establish a pulse delay ΔT equal to n×τ where n equals the number of delay segments selected. The pulse input 702 enters the first delay segment 732a at 731 and the pulse input is delayed an additional time equal to τ after passing through each delay segment. Delay segments 732 can be implemented, for example, through the use of shift registers, timers, or other known forms in the art for establishing a pulse delay. The resulting delayed pulse 734 will be determined by the delay tap selection multiplexer (mux) 730, which is logically connected to the each of inputs/outputs of each delay segment 732. The multiplexor may be any multiplexor known to a person of ordinary skill to meet the logic, time, and response characteristics of a chosen circuit and frequency requirements. Selecting the desired pulse delay ΔT, and thus the desired delayed pulse 734, can be accomplished by selecting which delay segment 732 to read by the delay tap selection multiplexer 730 through the use of delay selection input 710, which may be selectable or configurable, for example, through a register setting or other configuration file. The delayed pulse 734 is then logically output to the precharge mode control 140 along with the pulse input 702 at 736.

As will be discussed below, the precharge mode control 740 inputs the pulse input 702, delayed pulse 734 and also may include an input mode selection 720 for selecting one of a plurality of operating modes. The precharge mode control 740 will be discussed below in terms of functional logical outputs and may be implemented using combinatorial logic systems using, for example, appropriate logical ORs, logical ANDs, logical, NANDs, and other combinatorial logic circuits known in the art. The input mode selection 720 may be a fixed input or it may be configurable, for example, as logical input, a register setting, or other configuration file. The precharge mode control 740 receives and further [processes] the pulse input 702 and delayed pulse 734 to determine when to switch on and off the main current and precharge current sources according to the configured mode. Depending on the mode selection, the precharge mode control 740 will output the desired main pulse output 750 and precharge pulse output 760 for controlling the VCSEL current sources, for example utilizing something similar to the iC-HK laser switch or another laser switch having a plurality of current sources based on the number of desired step currents. Additional logical components, for example amplifiers 741, may also be included depending on the particular circuit operational design requirements. The main pulse output 750 and precharge pulse output 760 are determined by the precharge mode control 740 depending on the mode selection 720 input. For example, the precharge mode control 740 may have one or more control modes, for example a rising edge control mode or a falling edge control mode, (based on the selected combinations of delayed pulse 734 and pulse input 702) to determine the features and timing of the precharge output, examples of which will be discussed with reference to FIGS. 8 and 9 below, respectively.

While precharge mode control 740 can be configured in any number of pulse delay control schemes to acquire a desired precharge time, an example rising-edge referenced pre-charge mode and an example falling-edge referenced pre-charge mode will be discussed with reference to FIGS. 8 and 9 and their accompanying logic level timing diagrams. Such timing diagrams are logic timing diagrams in which the upper displayed value represents a logic high and lower displayed value represents a logic low.

Figure 8:
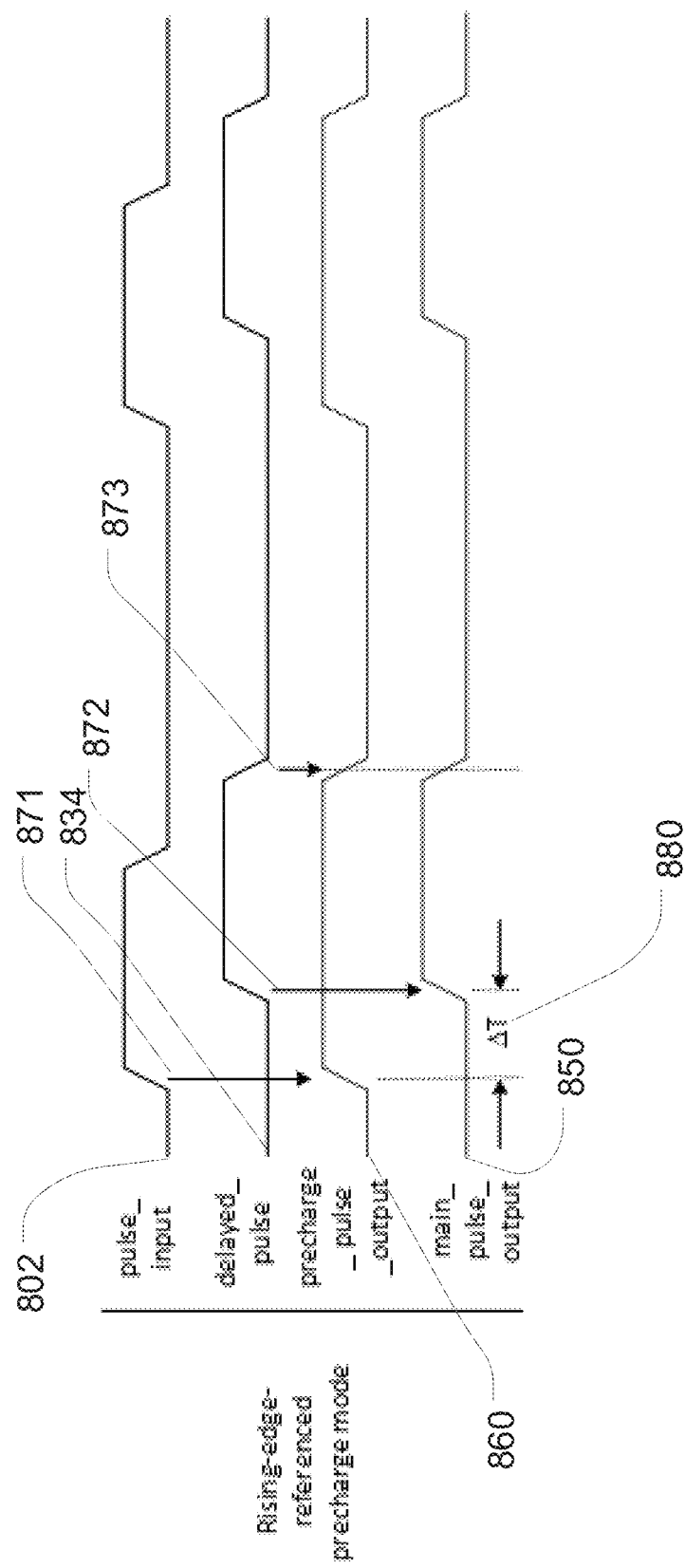
FIG. 8 shows an example logical timing diagram for a driver in accordance with disclosed embodiments.

FIG. 8 shows a timing diagram for an example rising-edge referenced pre-charge mode configuration of the precharge mode control 740 (FIG. 7). As shown, the timing diagram shows example inputs and outputs, for example, the pulse input 802, delayed pulse 834 (although not an input or output, delayed pulse 834 will be shown for explanation), precharge pulse output 860, and main pulse output 850. Pulse input 802, delayed pulse 834, precharge pulse output 860, and main pulse output 850 may, respectively, be equivalent to pulse input 702, delayed pulse 734, precharge pulse output 760, and main pulse output 750 discussed with reference to FIG. 7, but have been renumbered to distinguish from the timing diagram discussed with reference to FIG. 9 utilizing a different control mode.

As shown in FIG. 8, based on the combinatorial logic applied to pulse input 802 and delayed pulse 834, precharge mode control 740 detects the rising edge of pulse input 802 at 871, and precharge pulse output 860 is set to logic high by the precharge mode control 740 (FIG. 7) to trigger the precharge current source. Delayed pulse 834 is delayed from pulse input 802 by pulse delay ΔT 880, discussed above to be n*τ where n equals the number of delay segments selected. When the rising edge of delayed pulse 834 is detected at 872, the main pulse output 850 is set to logic high by the precharge mode control 740 to trigger the main current source. At 873, based on the detection of the falling edge of delayed pulse 834, the precharge pulse output 860 and the main pulse output 850 are set to logic low to turn off both the precharge and main current sources. This cycle can be repeated based on any pattern of pulse input 802 supplied by controller or processor. To implement logically, the precharge pulse output 860 is the logical OR of pulse input 802 and delayed pulse 834 and the main pulse output 850 logically follows the delayed pulse 834.

Figure 9:
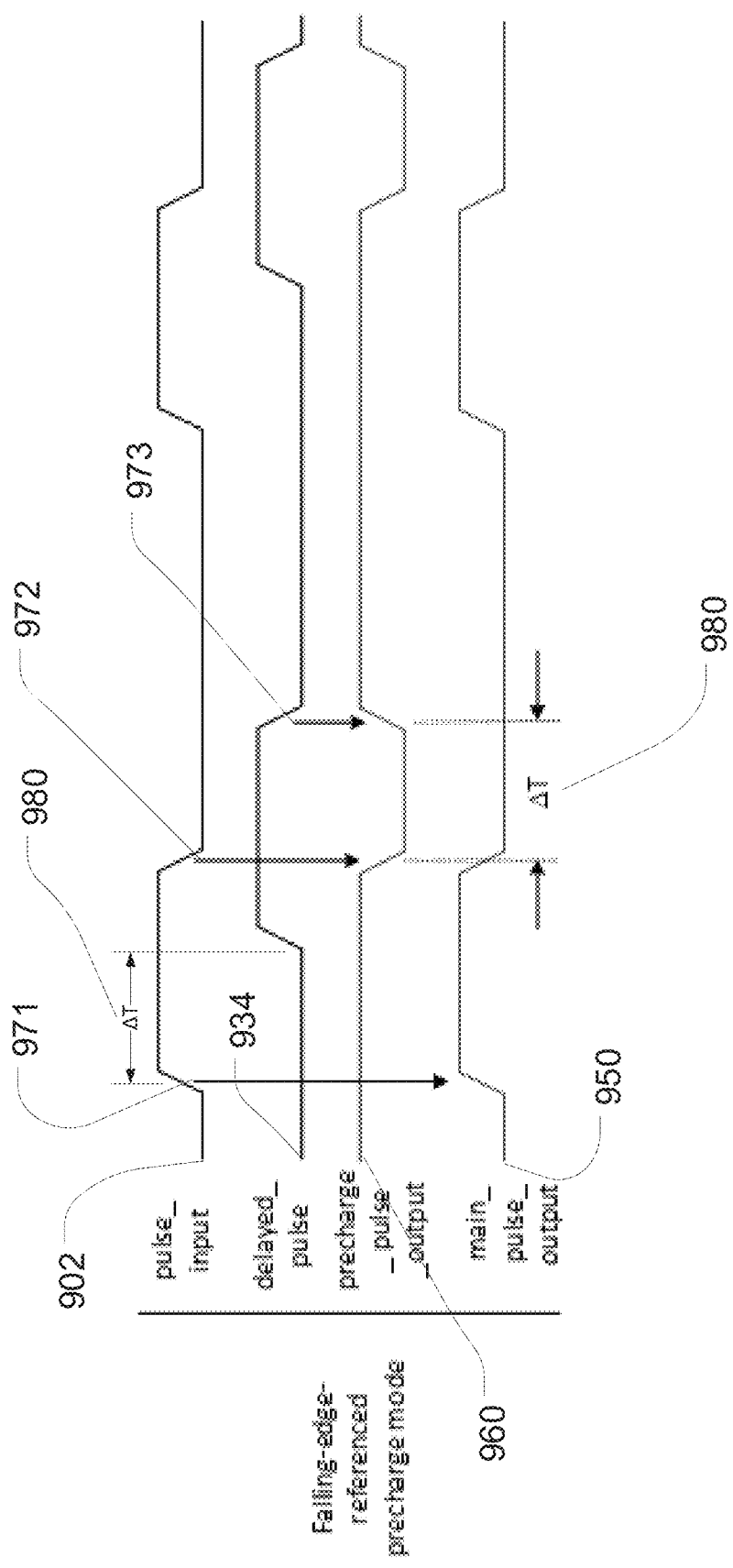
FIG. 9 shows an example logical timing diagram for a driver in accordance with disclosed embodiments.

FIG. 9 shows an alternative timing diagram for an example falling-edge referenced pre-charge mode configuration of the precharge mode control 740 (FIG. 7). As shown the timing diagram shows example inputs and outputs, for example, the pulse input 902, delayed pulse 934 (although not an input or output, delayed pulse 934 will be shown for explanation), precharge pulse output 960, and main pulse output 950. Pulse input 902, delayed pulse 934, precharge pulse output 960, and main pulse output 950 may, respectively, be equivalent to pulse input 702, delayed pulse 734, precharge pulse output 760, and main pulse output 750 discussed with reference to FIG. 7, but have been renumbered to distinguish from the timing diagram discussed with reference to FIG. 8 utilizing a different control mode.

As shown in FIG. 9, precharge pulse output 960 starts at a logic high (precharge current source on) based on a previous cycle or as a starting point indicating the precharge current source is on. Based on the combinatorial logic applied to pulse input 902 and delayed pulse 934, precharge mode control 740 detects the rising edge of pulse input 902 at 971, and main pulse output 950 is set to logic high by the precharge mode control 740 (FIG. 7) triggering the main current source on. Delayed pulse 934 is delayed from pulse input 902 by pulse delay ΔT 980. At 972, based on the detection of the falling edge of pulse input 902, the precharge pulse output 960 and the main pulse output 950 are set to logic low turning off the respective current sources. At 973, when the delayed pulse 973 transitions from high to low a time period of ΔT 980 after the pulse input did (at 972), the precharge pulse output 960 is set to logic high to trigger the precharge current on. The cycle may then be repeated with the next pulse input logic high signal supplied by controller or processor. To implement logically, the precharge pulse output 960 is the logical NAND of the inverse of the pulse input 902 and delayed pulse 934 and the main pulse output 950 logically follows the pulse input 902.

Selecting either rising-edge referenced pre-charge mode (discussed with reference to FIG. 8), falling-edge referenced pre-charge mode (discussed with reference to FIG. 9), or an alternative control mode using alternative logic depends on the desired mode of operation; other control modes will be apparent from the enclosed description. Adjustments can be made to either example control modes to account for various control schemes and each have different advantages. For example, the mode of operation of FIG. 8 offers the advantages of a specified precharge time period prior to turning the VCSEL to optical power output, while the mode of operation of FIG. 9 provides for a specified off period prior to initiating precharge of the VCSEL. It should be understood that each control mode can offer differing power and control advantages while still maintaining power and control savings by decreasing the VCSEL current and minimizing the real-time control requirements.

As shown in each of the configurations of FIGS. 8 and 9, the main and precharge current sources that each of the precharge pulse outputs 760, 860, 960 and the main pulse outputs 750, 850, 950 trigger (turn on) can be sized such that the precharge current source supplies the appropriate precharge current and the main current source supplies the current necessary for the desired VCSEL output minus the precharge current such that when both precharge pulse and main pulse outputs are set high, the currents from both the precharge and main current sources add together to supply the VCSEL current for the desired optical power output. However, it should be noted that other configurations are equally available. For example, the main current source could be sized to supply the full power and the outputs are adjusted to turn off the precharge current source when the main current source turns on. The timing diagrams and configurations can be adjusted accordingly.

Figure 10:
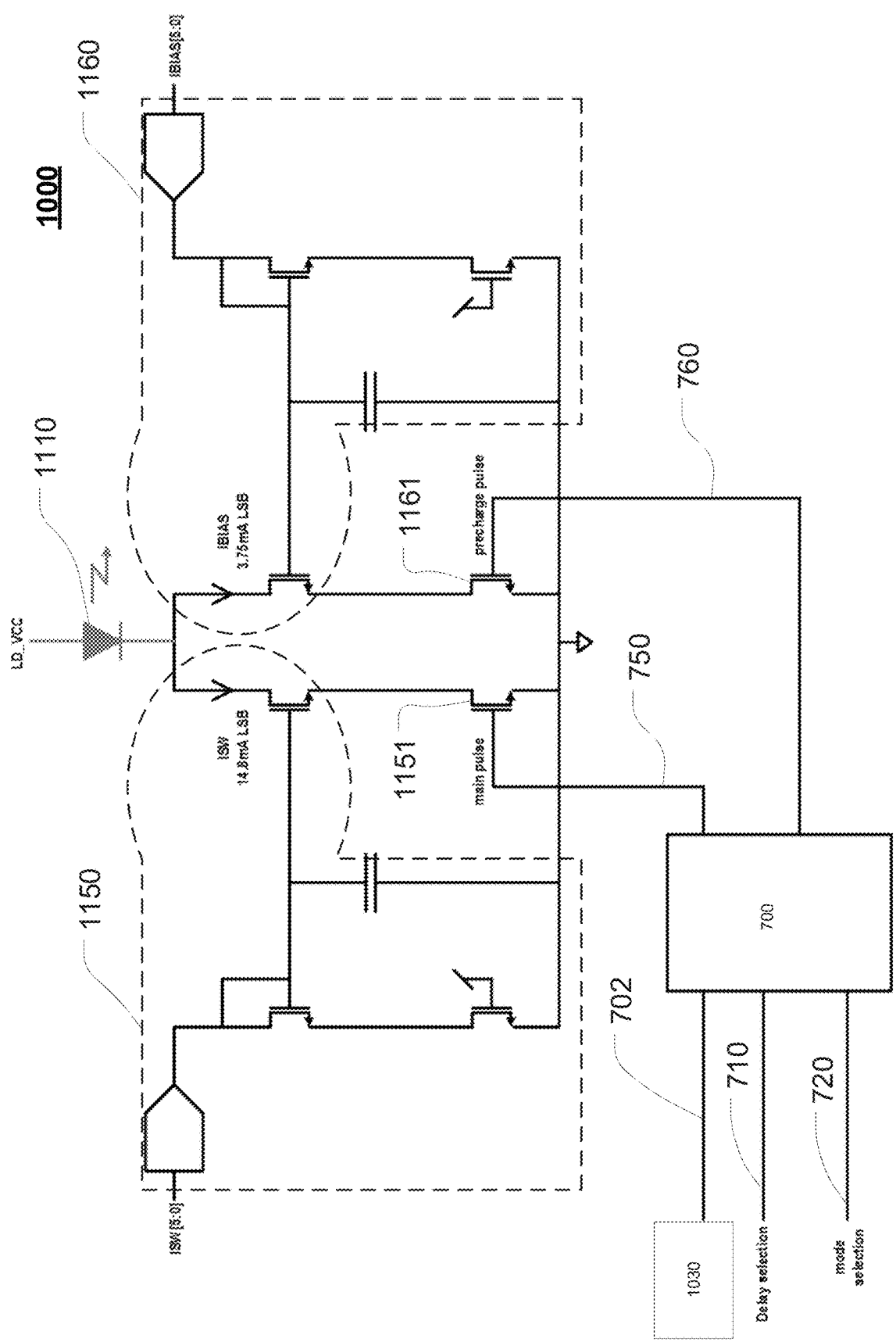
FIG. 10 shown an example electrical schematic showing a driver connected to a laser in accordance with disclosed embodiments.

Shown in FIG. 10 is a simple abbreviated electrical schematic 1000 showing the driver 700 for driving a laser 1110. The driver 700, which may be the same driver 700 of FIG. 700, receives the pulse input 702 from the applicable control processor 1030. The selection inputs 710, 720 are used to, respectively, to select the delay τ and the precharge mode. Based on the pulse input 702 and the inputs 710, 720, the driver 700 outputs main pulse output 750 and precharge pulse output 760. The main pulse output 750 can be used to trigger a main current source 1150 by logically connecting the main pulse output 750 to a current switch, for example, a transistor 1151, a fast switching relay, or the like. Similarly, the precharge pulse output 760 can be used to trigger a precharge current source 1160 by being logically connecting the precharge pulse output 760 to a similar current switch, for example, a transistor 1161. Whether one or both of transistors 1151, 1161 are switched on will determine how much current will ultimately pass through the laser 1110. As noted previously, current sources 1150, 1160 and transistors 1151, 1161 need not be separate from driver 700 and may be included within driver 700 or within modulation module 140 (FIG. 2) depending on the particular application.

Main current source 1150 and precharge current source 1160 may be any current sources known in the art, however as shown is one example configuration that utilizes the output of a digital to analog converter (DAC) having a plurality of bits (as shown it has 6 bits) to configure a drive current for each current source having between LSB mA and LSB×2^B mA, where LSB represents the current for the least significant bit and B is the number of bits in the current source DAC output. Therefore, as shown, the main current source 1150 has a configurable current output from about 14.8 mA to about 14.8×2^5 mA, which would be configured for the selected laser 1110.

While block diagrams and electrical schematics are shown in this disclosure indicating that one or more components are connected to others it should be noted that such connection may be directly electrically connected or it may be logically connected with interceding components to communicate or translate the logical signal from one component to another. It should also be understood that a logic high or a logic low is shown throughout figures, and the accompanying description, as showing a high point for logic high (or ON) and low point for logic low (or OFF) and that the definitions of what voltages represent each a logic high or a logic low may be adjusted according to particular applications.

What is claimed as new and desired to be protected by Letters Patent of the United States is:

1. A driver for driving a laser comprising:
   a pulse input for receiving one or more logical pulse control signals;
   a delay circuit adapted to delay the one or more logical pulse control signals as one or more delayed pulses, wherein the one or more delayed pulses is offset, respectively, from the one or more logical pulse control signals by a delay ΔT, wherein the delay circuit comprises:
      a delay tap multiplexor for selecting at least one of the one or more delay segments and the delay circuit comprises a delay selection input configured to select the number of delay segments; and
      one or more delay segments, and each delay segment is adapted to provide a delay of τ;
   a main pulse output adapted to trigger the laser's main current source; and
   a precharge pulse output adapted to trigger the laser's precharge current source; and
   control circuitry adapted to receive the one or more logical pulse control signals and the one or more delayed pulses and configured to selectively drive the main pulse output and the precharge pulse output to power the laser based on the received signals.

2. The driver of claim 1, wherein each of the main pulse output and the precharge pulse output is logically connected to a main current source and a precharge current source, respectively, and the precharge current source is adapted to supply a current through the laser greater than zero and less than a threshold current for the laser.

3. A driver for driving a laser comprising:
   a pulse input for receiving one or more logical pulse control signals;
   a delay circuit adapted to delay the one or more logical pulse control signals as one or more delayed pulses;
   a main pulse output adapted to trigger the laser's main current source, wherein the one or more delayed pulses is offset, respectively, from the one or more logical pulse control signals by a delay ΔT;
   a precharge pulse output adapted to trigger the laser's precharge current source; and
   control circuitry adapted to receive the one or more logical pulse control signals and the one or more delayed pulses and configured to selectively drive the main pulse output and the precharge pulse output to power the laser based on the received signals,
   wherein the driver is adapted to drive the precharge pulse output to a logical high when the pulse input is driven to a logical high.

4. The driver of claim 3, wherein the driver is adapted to drive the main pulse output to a logical high a delay ΔT after the precharge pulse output is driven to a logical high.

5. The driver of claim 4, wherein the driver is adapted to drive each of the main pulse output and the precharge pulse output to a logical low a delay ΔT after the pulse input is driven to logical low.

6. The driver of claim 5, wherein the driver is adapted to drive each of the main pulse output and the precharge pulse output to a logical low when a transition of a delayed pulse from a logical high to a logical low occurs.

7. A driver for driving a laser comprising:
   a pulse input for receiving one or more logical pulse control signals;
   a delay circuit adapted to delay the one or more logical pulse control signals as one or more delayed pulses;
   a main pulse output adapted to trigger the laser's main current source; wherein the one or more delayed pulses is offset, respectively, from the one or more logical pulse control signals by a delay ΔT;
   a precharge pulse output adapted to trigger the laser's precharge current source; and
   control circuitry adapted to receive the one or more logical pulse control signals and the one or more delayed pulses and configured to selectively drive the main pulse output and the precharge pulse output to power the laser based on the received signals,
   wherein the driver is adapted to drive the main pulse output to a logical high when the pulse input is driven to a logical high.

8. The driver of claim 7, wherein the driver is adapted to drive each of the main pulse output and the precharge pulse output to a logical low when the pulse input is driven to a logical low.

9. The driver of claim 8, wherein the driver is adapted to drive the precharge pulse output to a logical high a delay ΔT after the pulse input is driven to a logical low.

10. The driver of claim 9, wherein the driver is adapted to drive the precharge pulse output to a logical high when a transition of a delayed pulse from a logical high to a logical low occurs.

11. A method for driving a laser comprising:
    providing a control signal to a pulse input, wherein the pulse input includes one or more logical pulse control signals;
    generating a delayed pulse by delaying the one or more logical pulse control signals by a delay ΔT;
    driving the laser by outputting a main pulse output and a precharge pulse output based on the pulse input and the delayed pulse, wherein driving the laser comprises:
    driving a precharge current source with the precharge pulse output:
    driving the precharge pulse output to a logical high when the pulse input is driven to a logical high; and
    driving the main pulse output to a logical high a delay ΔT after the precharge pulse output is driven to a logical high; and
    driving a main current source with the main pulse output, wherein the precharge current source is adapted to supply a current through the laser greater than zero and less than a threshold current for the laser.

12. The method of claim 11, further comprising selecting the delay ΔT by selecting a number of delay segments each representing a time τ, wherein the delay ΔT equals n multiplied by t, where n equals the number of delay segments selected.

13. The method of claim 11, wherein driving the laser comprises driving each of the main pulse output and the precharge pulse output to a logical low a delay ΔT after the pulse input is driven to logical low and driving each of the main pulse output and the precharge pulse output to a logical low when a transition of a delayed pulse from a logical high to a logical low occurs.

14. A method for driving a laser comprising:
    providing a control signal to a pulse input, wherein the pulse input includes one or more logical pulse control signals;
    generating a delayed pulse by delaying the one or more logical pulse control signals by a delay ΔT;
    driving the laser by outputting a main pulse output and a precharge pulse output based on the pulse input and the delayed pulse, wherein driving the laser comprises driving the main pulse output to a logical high when the pulse input is driven to a logical high and driving the main pulse output and the precharge pulse output to a logical low when the pulse input is driven to a logical low;

driving a precharge current source with the precharge pulse output; and driving a main current source with the main pulse output, wherein the precharge current source is adapted to supply a current through the laser greater than zero and less than a threshold current for the laser.

15. The method of claim 14, wherein driving the laser comprises driving the precharge pulse output to a logical high a delay ΔT after the pulse input is driven to a logical low and driving the precharge pulse output to a logical high when a transition of a delayed pulse from a logical high to a logical low occurs.

16. A device for imaging a three-dimensional subject, the device comprising:

a transmitter having at least one laser configured to output optical signals;

a driver coupled to the transmitter; the driver comprising:
a pulse input for receiving one or more logical pulse control signals;
a delay circuit adapted to delay the one or more logical pulse control signals as one or more delayed pulses;
a main pulse output adapted to trigger the laser's main current source;
a precharge pulse output adapted to trigger the laser's precharge current source; and
control circuitry adapted to receive the one or more logical pulse control signals and the one or more delayed pulses and configured to selectively drive the main pulse output and the precharge pulse output to power the laser based on the received signals;

a receiver having an array of photodiodes configured to receive the output optical signals reflected from the three-dimensional subject; and processing circuitry coupled to the receiver array and the driver, the processing circuitry configured to process the received optical signals synchronized with the output optical signals for imaging the three-dimensional subject.

* * * * *